United States Patent
Suehiro et al.

(10) Patent No.: US 8,129,743 B2
(45) Date of Patent: Mar. 6, 2012

(54) LIGHT EMITTING DEVICE

(75) Inventors: Yoshinobu Suehiro, Aichi-ken (JP); Shigeo Takaya, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 505 days.

(21) Appl. No.: 12/222,183

(22) Filed: Aug. 4, 2008

(65) Prior Publication Data
US 2009/0050926 A1 Feb. 26, 2009

(30) Foreign Application Priority Data

Aug. 23, 2007 (JP) .................................. 2007-216799

(51) Int. Cl.
H01L 33/00 (2010.01)

(52) U.S. Cl. ............... 257/100; 257/99; 257/E33.062; 257/E33.063; 257/E33.064; 257/E33.065; 257/E33.068

(58) Field of Classification Search .................. 257/100, 257/E33.065, E33.064, 99, E33.068, E33.062, 257/E33.063

See application file for complete search history.

(56) References Cited

U.S. PATENT DOCUMENTS

| | | | | |
|---|---|---|---|---|
| 6,281,526 B1 * | 8/2001 | Nitta et al. | ................. | 257/103 |
| 6,573,537 B1 * | 6/2003 | Steigerwald et al. | ........... | 257/99 |
| 6,812,502 B1 * | 11/2004 | Chien et al. | ................. | 257/99 |
| 6,858,873 B2 * | 2/2005 | Lee | ................. | 257/81 |
| 7,344,967 B2 * | 3/2008 | Yoshida et al. | ............... | 438/608 |
| 2006/0049335 A1 * | 3/2006 | Suehiro et al. | ............. | 250/214.1 |
| 2006/0113906 A1 | 6/2006 | Ogawa | | |
| 2006/0261364 A1 | 11/2006 | Suehiro et al. | | |
| 2006/0273335 A1 * | 12/2006 | Asahara et al. | ................. | 257/98 |

FOREIGN PATENT DOCUMENTS

| | | |
|---|---|---|
| JP | 2006-156668 | 6/2006 |
| WO | 2004/082036 A1 | 9/2004 |

\* cited by examiner

*Primary Examiner* — Stephen W Smoot
*Assistant Examiner* — Vicki B Booker
(74) *Attorney, Agent, or Firm* — McGinn IP Law Group, PLLC (57) ABSTRACT

A light emitting device includes a light emitting element, an element mounting board including a wiring layer on an element mounting surface thereof, and a sealing portion that seals the light emitting element. The light emitting element includes a contact electrode including a transparent conductive film, a transparent dielectric layer formed on a surface of the contact electrode and including a refractive index lower than the contact electrode, and a pad electrode electrically connected to the contact electrode. The light emitting element is flip-chip mounted on the wiring layer. A part of the transparent dielectric layer is formed between the contact electrode and the pad electrode.

20 Claims, 8 Drawing Sheets

LIGHT EMITTING DEVICE

The present application is based on Japanese patent application No. 2007-216799 filed on Aug. 23, 2007, the entire contents of which are incorporated herein by reference.

BACKGROUND OF THE INVENTION

1. Field of the Invention

This invention relates to a light emitting device that a light emitting element is glass-sealed on a mounting board.

2. Description of the Related Art

A light emitting device (WO2004/082036) is proposed by the inventors et al. where a light emitting element such as a light emitting diode (LED) is used as a light source, and the light emitting element is glass-sealed by bonding a plate glass to a mounting board with the light emitting element mounted thereon by hot pressing. In the light emitting device (WO2004/082036), the light emitting element is flip-chip mounted on the mounting board. This is because face-up mounting requiring wire bonding is difficult to keep electrical connection since deformation of wire may be caused by high temperature and viscosity of glass during hot pressing.

JP-A-2006-156668 discloses a light emitting device that n-side electrode and p-side electrode of a light emitting element are bonded via a bump to an electrode on a mounting board. JP-A-2006-156668 teaches to use the bump that is formed of a metal such as Ag or its alloy to prevent short circuit caused by being softened due to heated and softened glass.

However, JP-A-2006-156668 has the problem that light emitted toward the mounting board is inputted to a metal surface of a wiring layer etc. formed on the light emitting element or the mounting board and metal reflection absorption loss is generated when light is reflected thereon. Therefore, light extraction efficiency lowers by the light loss. Especially, in case of flip-chip mounting, the size of a p-side pad electrode is increased to secure the electrical connection and, therefore, metal reflection absorption loss or light loss is also generated at the p-side pad electrode when light emitted from the light emitting element is inputted to the p-side pad electrode.

SUMMARY OF THE INVENTION

It is an object of the invention to provide a light emitting device that can suppress absorption loss by reflection of light emitted from a light emitting element to enhance the light extraction efficiency.

(1) According to one embodiment of the invention, a light emitting device comprises:

a light emitting element comprising a contact electrode comprising a transparent conductive film, a transparent dielectric layer formed on a surface of the contact electrode and comprising a refractive index lower than the contact electrode, and a pad electrode electrically connected to the contact electrode;

an element mounting board comprising a wiring layer on an element mounting surface thereof, the light emitting element being flip-chip mounted on the wiring layer; and a sealing portion that seals the light emitting element, wherein a part of the transparent dielectric layer is formed between the contact electrode and the pad electrode.

In the above embodiment (1), the following modifications and changes can be made.

(i) The sealing portion comprises an inorganic material.
(ii) The inorganic material comprises a fused glass.
(iii) The transparent dielectric layer comprises a bonding plane to the contact electrode, and the bonding plane comprises an area smaller than an area of a top surface of the pad electrode.
(iv) The pad electrode comprises an annular bonding portion to the contact electrode, and the bonding plane is formed except the annular bonding portion of the pad electrode.
(v) The pad electrode comprises a radial bonding portion to the contact electrode, and the bonding plane is formed except the radial bonding portion of the pad electrode.
(vi) The transparent dielectric layer covers a surface (e.g., a side face and a part of a top face) of the pad electrode.
(vii) The pad electrode comprises nickel (Ni) and gold (Au).
(viii) The pad electrode comprises silver (Ag).
(ix) The contact electrode comprises ITO (indium tin oxide).
(x) The wiring layer comprises a silver (Ag) layer on a top thereof.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
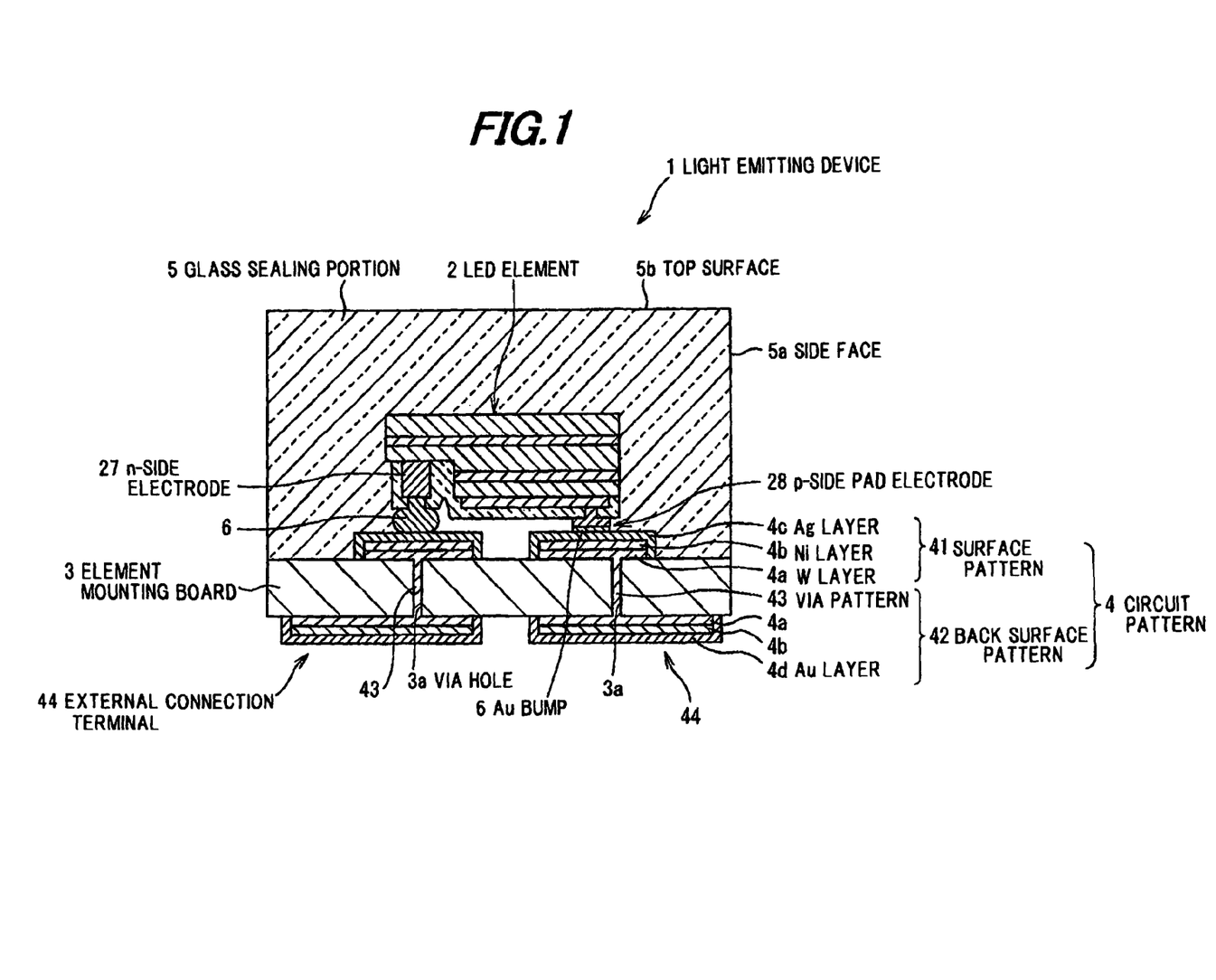
FIG. 1 is a cross sectional view showing a glass-sealed LED as a light emitting device in a first preferred embodiment according to the invention.

FIG. 1 is a cross sectional view showing a glass-sealed LED as a light emitting device in the first preferred embodiment according to the invention.

As shown in FIG. 1, the light emitting device 1 is composed of an LED element 2 which is a flip-chip type light emitting element formed of a GaN based semiconductor material, an element mounting board 3 for mounting the LED element 2 thereon; a circuit pattern 4 formed on the element mounting board 3 for supplying power to the LED element 2 via an n-side electrode 27 and a p-side pad electrode 28 which is low in light loss and severs as a board bonding electrode, and a glass sealing portion 5 which seals the LED element 2 on the element mounting board 3. A glass-sealed LED is composed of the LED element 2, the element mounting board 3, the circuit pattern 4 and the glass sealing portion 5.

Figure 2A:
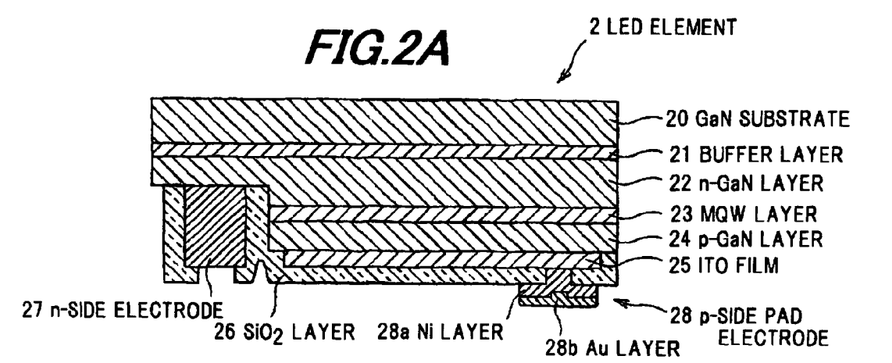
FIG. 2A is a cross sectional view showing an LED element in the first embodiment.
Figures 2B, 2D:
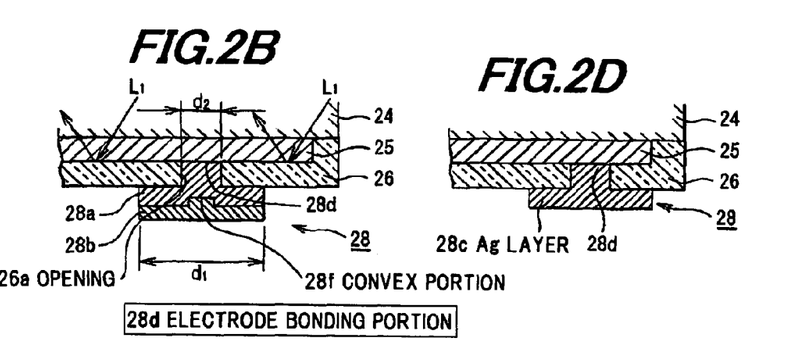
FIG. 2B is an enlarged cross sectional view showing a p-side pad electrode in FIG. 2A.
FIG. 2D is an enlarged cross sectional view showing a modification of the p-side pad electrode in the first embodiment.
Figure 2C:
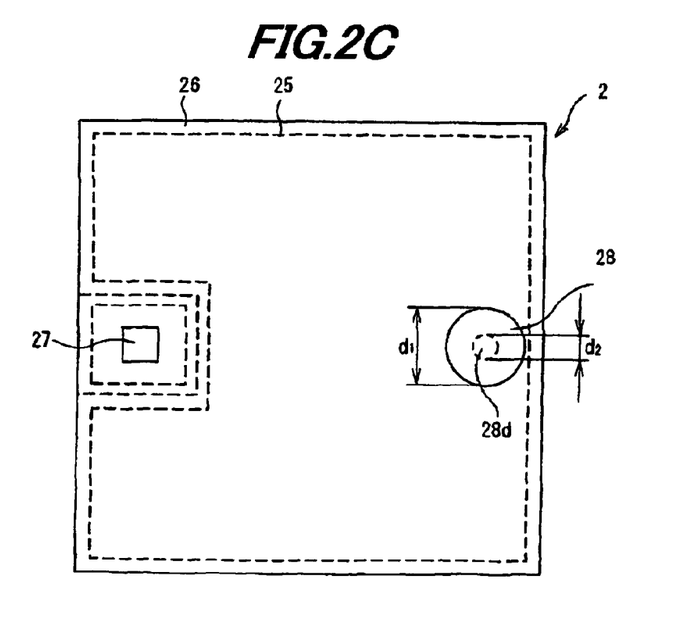
FIG. 2C is a bottom view showing an electrode formation surface of the LED element in FIG. 2A.

FIG. 2A is a cross sectional view showing the LED element 2 in the first embodiment. FIG. 2B is an enlarged cross sectional view showing the p-side pad electrode 28 in FIG. 2A. FIG. 2C is a bottom view showing an electrode formation surface of the LED element 2 in FIG. 2A. FIG. 2D is an enlarged cross sectional view showing a modification of the p-side pad electrode 28 in the first embodiment.

As shown in FIG. 2A, the LED element 2 as a light emitting element is constructed such that a GaN based semiconductor material is epitaxially grown on the surface of a GaN substrate 20 of GaN, group III nitride based semiconductor material, for example, grown in the order of a buffer layer 21, an n-GaN layer 22, an MQW layer 23 and a p-GaN layer 24. The LED element 2 is epitaxially grown at 700° C. or higher, and it is 600° C. or higher in allowable temperature limit. It is stable at working temperature during sealing process, described later, using a low-melting point fused glass.

The LED element 2 is formed 320 μm thick and 346 μm square and $5 \times 10^{-6}/°$ C. in thermal expansion coefficient. In figures of this application, the components of the LED element 2 are shown different from actual dimensions so as to express clearly them. In applying a voltage to the n-side electrode 27 and the p-side pad electrode 28, the MQW layer 23 of the LED element 2 emits blue light with a peak wavelength of, e.g., 460 nm.

The LED element 2 is further composed of an ITO ($In_2O_3$—$SnO_2$, indium tin oxide) film 25 that is a contact electrode formed on the surface of the p-GaN layer 24 and n=2.0 in refractive index, the p-side pad electrode 28 electrically connected to the ITO layer 25, and the n-side electrode 27 formed on the n-GaN layer 22 exposed by partially etching the p-GaN layer 24 through the n-GaN layer 22. The electrode formation surface of the LED element 2 except the electrode bonding portion on the n-side electrode 27 and the p-side pad electrode 28 is covered with a transparent dielectric layer, i.e., a $SiO_2$ layer 26 with n=1.5. In this embodiment, the thickness of the $SiO_2$ layer 26 is 1000 to 3000 Å.

As shown in FIG. 2B, the p-side pad electrode 28 is composed of a Ni layer 28a that is bonded to the ITO layer 25 through an opening 26a formed in the $SiO_2$ layer 26, and a Au layer 28b formed on the surface of the Ni layer 28a. It is formed circular (bottom view) and structured such that a diameter $d_2$ of an electrode bonding portion 28d where the Ni layer 28a contacts the ITO layer 25 is smaller than a diameter $d_1$ of a portion (i.e., the surface of the Au layer 28b) bonded to a surface pattern 41 of the element mounting board 3. In this embodiment, the $SiO_2$ layer 26 located directly under the p-side pad electrode 28 is formed to have an area smaller than the top surface area of the p-side pad electrode 28 and, thereby, a low optical loss structure with a reduced light loss caused by light reflection at the p-side pad electrode 28 can be obtained as well as electrical bonding property. A convex portion 28f in the Au layer 28b is formed according to a concave portion yielded when forming the Ni layer 28a. In this embodiment, $d_1=100$ μm and $d_2=25$ μm are adopted.

Light $L_1$ emitted toward the electrode formation surface from the MQW layer 23 is inputted through the ITO layer 25 onto an interface to the $SiO_2$ layer 26 (See FIG. 2B), and a part thereof is reflected thereon toward the MQW layer 23 by total reflection based on the refractive index difference between the ITO layer 25 and the 3 $SiO_2$ layer 26, and discharged outside the LED element 2 through the GaN substrate 20. Here, since the diameter $d_2$ of the electrode bonding portion 28d is smaller than the diameter $d_1$ of a portion formed outside the $SiO_2$ layer 26, the light reflection area is reduced. Thus, the metal reflection absorption loss by the electrode bonding portion 28d can be reduced so that light $L_1$ emitted toward the electrode formation surface can be efficiently reflected to be discharged outside the LED element 2.

As shown in FIG. 2C, the LED element 2 of this embodiment is provided with one n-side electrode 27 and one p-side pad electrode 28, and the n-side electrode 27 and the p-side pad electrode 28 are disposed parallel to the side of the LED element 2 such that the metal reflection absorption loss by the electrode bonding portion 28d can be minimized as much as possible.

The element mounting board 3 is formed of alumina ($Al_2O_3$) polycrystalline sintered material, formed 0.25 mm thick and 1.0 mm square, and $7 \times 10^{-6}/°$ C. in thermal expansion coefficient. As shown in FIG. 1, the circuit pattern 4 on the element mounting board 3 is composed of a surface pattern 41 formed on the surface of the board and electrically connected to the LED element 2, and a back surface pattern 42 formed on the back surface of the board and electrically connected to an external terminal. The surface pattern 41 includes a tungsten (W) layer 4a patterned according to the shape of the electrodes of the LED element 2, a thin-film nickel (Ni) layer 4b covering the surface of the W layer 4a, and a thin-film silver (Ag) layer 4c covering the surface of the Ni layer 4b. The back surface pattern 42 includes a W layer 4a patterned according to an external connection terminal 44 (described later), a thin-film Ni layer 4b covering the surface of the W layer 4a, and a thin-film gold (Au) layer 4d covering the Ni layer 4b. The surface pattern 41 and the back surface pattern 42 are electrically connected each other through a via pattern 43 of W formed in a via hole 3a passing through the element mounting board 3 in the thickness direction. The external connection terminal 44 is provided one each of anode side and cathode side. The external connection terminal 44 is diagonally (bottom view) disposed on the element mounting board 3.

The glass sealing portion 5 is formed of a ZnO—$B_2O_3$—$SiO_2$—$Nb_2O_5$—$Na_2O$—$Li_2O$ based fused glass (herein a fused glass being defined as glasses including primarily silica and produced by melt quenching). The ingredients of the glass are not limited to this composition. For example, the fused glass may not include $Li_2O$ and may include, as arbitrary components, $ZrO_2$, $TiO_2$ etc. As shown in FIG. 1, the glass sealing portion 5 is formed like a rectangular solid such that the thickness from the element mounting board 3 to a top surface 5b is 0.5 mm. A side face 5a of the glass sealing portion 5 is formed such that a plate glass is bonded to the element mounting board 3 by hot pressing and the plate glass with the element mounting board 3 bonded thereto is then cut by a dicer. The top surface 5b of the glass sealing portion 5 corresponds to one surface of the plate glass thus bonded to the element mounting board 3 by hot pressing. The fused glass is 490° C. in glass transition temperature (Tg) and 520° C. in yielding point (At). The glass transition temperature (Tg) is sufficiently lower than the formation temperature for the epitaxial layers of the LED element 2. The thermal expansion coefficient (α) of the fused glass is $6 \times 10^{-6}/°$ C. in the range of 100 to 300° C. The thermal expansion coefficient (α) will increase at temperature higher than the glass transition temperature (Tg). This allows the fused glass to be bonded to the element mounting board 3 by hot pressing at about 600° C. The fused glass composing the glass sealing portion 5 is 1.7 in refractive index.

The composition of the fused glass is not specifically limited if only the glass transition temperature (Tg) is lower than the allowable temperature limit of the LED element 2 and the thermal expansion coefficient (α) is equivalent to the element mounting board 3. For example, glasses with relatively low glass transition temperature (Tg) and relatively small thermal expansion coefficient (α) can include $ZnO-SiO_2-R_2O$ based glass (where R is at least one selected from group I elements such as Li, Na and K), phosphate glass and lead glass. Of these glasses, the $ZnO-SiO_2-R_2O$ based glass is preferable since it is better in humidity resistance than the phosphate glass and it causes no environmental problem as in the lead glass.

The glass sealing portion 5 may include a phosphor dispersed therein. The phosphor can be a yellow phosphor that emits yellow light with a peak wavelength in a yellow region by being excited by blue light emitted from the MQW layer 23, and the glass-sealed LED to radiate white light can be obtained thereby. In this embodiment, such a phosphor may be a YAG (yttrium aluminum garnet) phosphor. For example, the phosphor is about 10 μm in average diameter and preferably about 2.2% by weight included in the glass sealing portion 5. The phosphor may be a silicate phosphor or a mixture of YAG and the silicate phosphor at a predetermined ratio.

A method of making the light emitting device 1 will be described below.

The element mounting board 3 with the via hole 3a formed therein is provided. W paste is screen printed according to the circuit pattern 4 on the surface of the element mounting board 3. Then, the element mounting board 3 with the W paste printed thereon is thermally treated at about 1000° C. such that the W is baked onto the element mounting board 3. Then, nickel (Ni) is plated on the W, and silver (Ag) is further plated thereon on the surface side and gold (Au) is plated thereon on the back surface side to form the circuit pattern 4.

Then, the LED element 2 is electrically bonded through Au bump to the surface pattern 41 of the circuit pattern 4 on the element mounting board 3. In this embodiment, the bumps are bonded twice in total, i.e., each one for the p-side and the n-side.

Then, the element mounting board 3 with the LED element 2 mounted thereon is placed on a lower mold and the plate fused glass placed on an upper mold. The lower mold and the upper mold are each provided with a heater built therein and each of them is independently temperature-controlled. Then, the molds are each positioned such that the plate fused glass is stacked on the substantially flat surface (mounting surface) of the element mounting board 3. Then, by pressing the lower and upper molds while heating them, the hot pressing is conducted in nitrogen atmosphere. Thus, the plate fused glass is bonded onto the element mounting board 3 with the LED element 2 mounted thereon such that the LED element 2 is sealed with the fused glass on the element mounting board 3. The hot pressing may be conducted in atmosphere, e.g., in vacuum, inactive to the components. As a result, the fused glass can be bonded to the element mounting board 3 through oxides included in these materials.

By the above process, an intermediate product with the plural light emitting devices 1 connected laterally can be produced. Then, the intermediate product (i.e., the element mounting board 3 integrated with the glass sealing portion 5) is placed on a dicer and diced to be separated into LED elements 2. The separation of the LED element 2 is not specifically limited and may be conducted by a laser etc. Thus, the light emitting device 1 can be completed.

In operation of the light emitting device 1 thus constructed, when voltage is applied through the circuit pattern 4 to the LED elements 2, blue light is emitted radially from the LED elements 2. Of light emitted from the LED element 2, light inputted to the side face 5a of the glass sealing portion 5 is reflected toward the top surface 5b on the interface between the glass sealing portion 5 and the air. If the side face 5b is an ideal flat surface without concavity and convexity on the interface of the glass sealing portion 5 and the air, light inputted to the side face 5b is all reflected thereon. This is because a total reflection condition is established at the interface since the air is lower in refractive index than the glass sealing portion 5. The interface reflection yields no optical loss.

Here, on the surface of the glass sealing portion 5, concavity and convexity is generated due to the hot pressing, the separation process of the intermediate product etc. Although the concavity and convexity is significantly generated on a surface formed in case of dicer cutting, it must be generated to some degree even in case of laser cutting. Therefore, a part of light inputted to the interface of the glass sealing portion 5 and the air may be discharged through the interface without being reflected thereon.

Of light emitted toward the electrode formation surface from the MQW layer 23 of the LED element 2, light within a critical angle defined between the ITO layer 25 and the SiO2 layer 26 passes through the SiO2 layer 26 as a transparent dielectric layer and is discharged outside the LED element 2, where a part thereof is reflected on the Ag layer 4c on the surface of the surface pattern 41. Light of 460 μm emitted from the MQW layer 23 is small in loss caused by the reflection on the Ag layer 4c, and therefore the optical loss can be suppressed to enhance the light extraction efficiency. On the other hand, light out of the critical angle defined between the ITO layer 25 and the SiO2 layer 26 is totally reflected on the interface of the ITO layer 25 and the SiO2 layer 26 and discharged in the light extraction direction of the LED element 2. Further, although a part of light is reflected on the electrode bonding portion 28d, the area of the electrode bonding portion 28d is sufficiently smaller than that of the ITO layer 25 as a contact electrode and the electrode bonding portion 28d is formed of silver (Ag) so that optical loss of the reflection can be reduced sufficiently.

As described above, on the surface of the ITO layer 25 as a contact electrode, the SiO2 layer 26 as a transparent dielectric layer is formed that is lower in refractive index than the ITO layer 25. And the p-side pad electrode 28 is formed to be electrically connected to the ITO layer 25 through the electrode bonding portion 28d that is formed in a small bonding area on the side of the element mounting board 3. Therefore, light emitted to the electrode formation surface from the MQW layer 23 can be reflected in the light extraction direction without causing optical loss by the total reflection based on the refractive index difference between the ITO layer 25 and the SiO2 layer 26 so that it can be externally discharged efficiently. Although a part of light emitted toward the electrode formation surface from the MQW layer 23 is reflected on the electrode bonding portion 28d composed of the Ni layer 28a, optical loss by the metal reflection absorption can be suppressed since the area of the electrode bonding portion 28d is considerably smaller than the bonding area on the element mounting board 3. The material of the contact electrode as a transparent conductive film is not limited to the ITO and may be a material with a refractive index sufficiently greater than the transparent dielectric layer 26. For example, as described earlier, in case of adopting $SiO_2$ with a refractive index of 1.5 as the transparent dielectric layer 26, the same function and effect can be obtained even by using another conductive oxide material such as AZO (Al—ZnO, refractive index n=2.0), IZO (In—ZnO, refractive index n=2.0), AZO-IZO (refractive index n=2.0) and Nb—$TiO_2$ (refractive index n=2.5).

Since the sealing material of the LED element 2 is of glass, it does not deteriorate due to heat etc. generated by emission of the LED element 2 as is the case for resin sealing materials. Therefore, relatively large current can be fed to the LED element 2 without considering the deterioration of the sealing material.

Since the surface pattern 41 has the Ag layer 4c on the top, metal reflection absorption loss at an emission wavelength of the LED element 2 can be reduced as compared to the case of a Au layer on the top. Silver (Ag) has the problems that it may cause migration by humidity and electrical field and that it may cause blackening by a reaction with a sulfur system odor substance, ozone, sulfur dioxide etc. in the air. However, the glass-sealed light emitting device 1 of this embodiment has such high bonding strength that causes no separation or peeling by difference in thermal expansion coefficient ($\alpha$) between the element mounting board 3 and the glass sealing portion 5. Therefore, no penetration of moisture or air is caused at the interface between the element mounting board 3 and the glass sealing portion 5, so that the surface pattern 41 using the Ag layer 4c as the top layer does not deteriorate for a long term and good light reflection property can be thereby maintained.

The glass sealing portion 5 is formed such that the LED element 2 bonded to the element mounting board 3 through the p-side pad electrode 28 is glass-sealed by the fused glass. The bonding strength of the n-side electrode 27 and the p-side pad electrode 28 can be reinforced by the high bonding strength between the element mounting board 3 and the glass sealing portion 5. Therefore, the light emitting device 1 can be excellent in reliability.

The light emitting device 1 of the first embodiment uses the two-point bonding type LED element 2 as an LED element. Thus, it can be reduced in metal reflection absorption loss as compared to a light emitting device 1 that has an electrode bonding structure of two points or more, and it can have the stable element sealing state by the glass sealing portion 5. The light emitting device 1 can have excellent light extraction efficiency and long-term reliability. The LED element 2 is not limited to the square LED element as described above and may be a rectangular LED element. Furthermore, plural LED elements 2 may be sealed in one light emitting device 1.

Since the glass sealing portion 5 is formed of the ZnO—$B_2O_3$—$SiO_2$—$Nb_2O_5$—$Na_2O$—$Li_2O$ based fused glass, the glass sealing portion 5 can be excellent in stability and weather resistance. Thus, even when the light emitting device 1 is used under severe environment for a long term, the glass sealing portion 5 can be protected from deterioration so that light extraction efficiency can be effectively prevented from lowering with time. Furthermore, since the glass sealing portion 5 has high refractive index and transparency, the light emitting device 1 can have both high reliability and high emission efficiency.

The glass can be optionally provided with an refractive index of n=1.6 or more that is difficult to adopt in transparent resin materials, and the LED element 2 uses the GaN substrate that has the same refractive index as the light emitting layer epitaxially grown with GaN. Thereby, light emitted from the light emitting layer can be led to the interface between the GaN substrate and the glass, and the critical angle at the interface between the GaN substrate and the glass can be reduced. Therefore, light emitted in the LED element 2 can be efficiently inputted to the glass. Further, the relationship of the width (W) to the height (H) in the LED element 2 is defined W$\leqq$2·H tan $\theta$ c where $\theta$ c represent a critical angle between GaN and glass), so that light radiated upward from the light emitting layer is mostly inputted through the side face or top face of the LED element 2 to the glass and does not go back to the bottom with the electrodes again. Owing to the glass with a refractive index of n=1.6 or more, light that may be confined and attenuated in the LED element 2 and can be effectively discharged outside the LED element 2.

Furthermore, glasses are ten times in thermal expansion coefficient higher than transparent resins so that heat generated from the glass-sealed LED element 2 can be dissipated into the air from the surface of the glass.

In this embodiment, the plate glass can be used to seal the plural LED elements 2 simultaneously and the glass-sealed LED 1 with multiple LED elements 2 can be easy mass produced by dicing. Meanwhile, since the fused glass is processed at high viscosity, it is not necessary to take means for preventing the overflow of the sealing material into account as is the case for resin sealing materials.

By flip-chip mounting the LED element 2, the high-brightness glass-sealed light emitting device 1 can be down-sized such that the LED element 2 is mounted in an area of 1.0 $\mu$m square. This is because no space for wire bonding is necessary. In addition, even with a small bonding space, separation at the interface does not occur since the glass sealing portion 5 and the element mounting board 3 equivalent to each other in thermal expansion coefficient can be used and they are bonded to each other at the interface by chemical bond.

Further, the LED element 2 can be equivalent in thermal expansion coefficient to the glass sealing portion 5, so that all the components including the element mounting board 3 are equivalent in thermal expansion coefficient to one another. Even in temperature difference between high temperature during the glass sealing and ambient temperature, internal stress is very small and, therefore, stable processability can be provided without having cracks. With the small internal stress, shock resistance thereof can be enhanced and the glass-sealed light emitting device 1 can be excellent in reliability.

The LED element 2 is smaller in thermal expansion coefficient than the glass sealing portion 5 and the element mounting board 3 as described above. In this embodiment, the glass sealing is conducted at high temperature higher than 300° C. such that the viscosity of the glass is reduced not to apply stress to the LED element 2 at temperature during the glass sealing. However, when cooled down to ambient temperature, the contraction of the glass sealing portion 5 and the element mounting board 3 is increased with respect to the LED element 2 where stress in compression direction will be applied to the LED element 2 from the glass sealing portion 5 and the element mounting board 3. In addition, during the operation environment lower than 300° C., the LED element 2 will be always stressed in compression direction from the glass sealing portion 5 and the element mounting board 3. Therefore, theoretically, the electrode bond of the LED element 2 and the bond between the LED element 2 and the element mounting board 3 cannot lapse into separation by stress (i.e., compression stress) applied. Further, especially by the $SiO_2$ layer 26, disconnection or high resistance due to the separation can be prevented even when the bonding area between the ITO layer 25 and the Ni layer 28a is reduced as shown FIG. 2B. Alternately, in case of providing inorganic coating by sol-gel method as a sealing material, although the LED element 2 is not always stressed in compression direction, the bond between the LED element 2 and the element mounting board 3 can be difficult to separate since the inorganic coating is smaller in thermal expansion coefficient than sealing resins.

By dividing the element mounting board 3 integrated with the glass sealing portion 5 by a dicer etc., the down-sized light emitting device 1 can be mass produced simultaneously. Thus, the light emitting device 1 can be reduced in production cost and excellent in mass productivity.

Since the element mounting board 3 is formed of alumina, the mass productivity and the production cost of the device can be enhanced since alumina is at low cost and easy available. Alumina is excellent in thermal conductivity so that the device composition can be sufficiently applied to a high brightness and high output device. Alumina is small in optical absorption so that it is advantageous in suppression of optical loss.

In the first embodiment, the light emitting device 1 uses the LED element 2 formed of GaN based semiconductor material. However, the LED element 2 is not limited to the GaN based LED element. For example, it may be formed of another semiconductor material such as ZnSe based, SiC based materials. The LED element 2 may have a peak wavelength in ultraviolet, green and red regions other than the blue region.

FIG. 2D is an enlarged cross sectional view showing a modification of the p-side pad electrode 28 in the first embodiment. The p-side pad electrode 28 of the modification is formed of only silver (Ag). Even when it is thus formed of only Ag, it can be stable in bonding strength, and it can cause no blackening and have long-term stability. The silver (Ag) used in the first embodiment is not limited pure silver and may include a small amount of metal such as Pt, Rh, Pb etc.

Figure 3A:
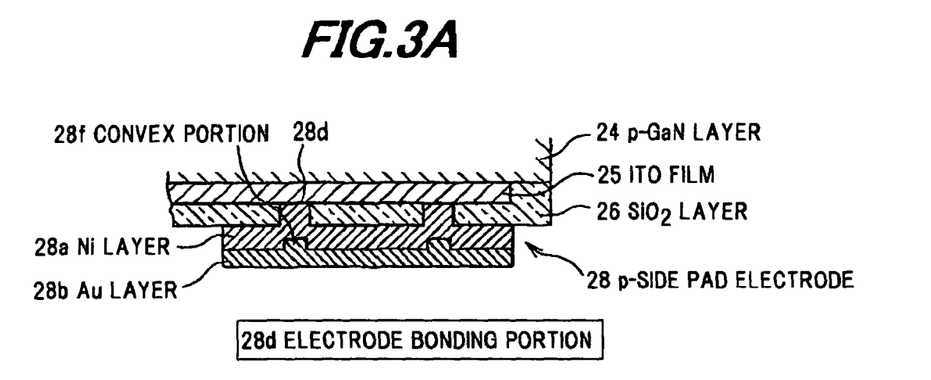
FIG. 3A is an enlarged cross sectional view showing another modification of the p-side pad electrode in the first embodiment.
Figure 3B:
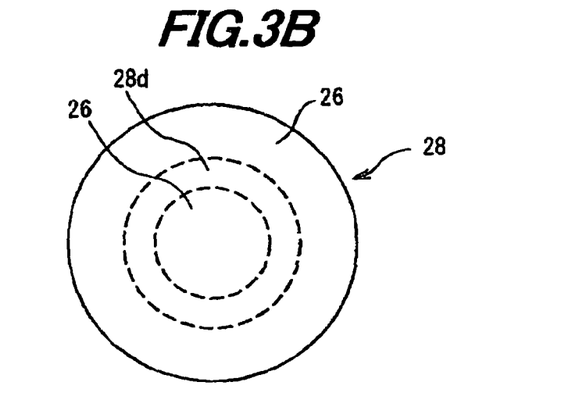
FIG. 3B is a bottom view (viewed from an element mounting board) showing the p-side pad electrode in FIG. 3A.
Figure 3C:
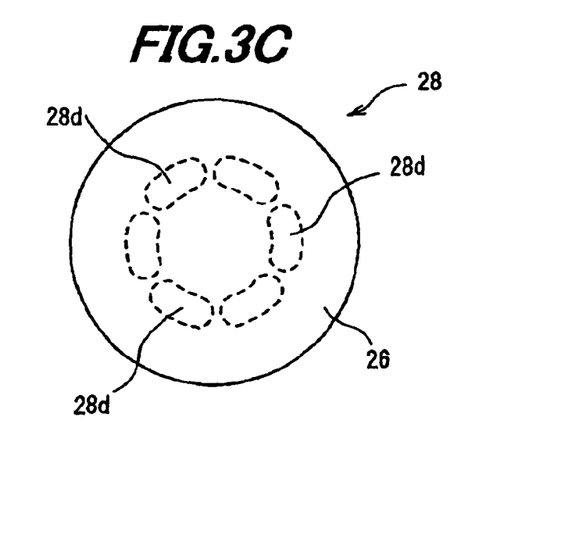
FIG. 3C is a bottom view showing a different shape of an electrode bonding portion.

FIG. 3A is an enlarged cross sectional view showing another modification of the p-side pad electrode in the first embodiment. FIG. 3B is a bottom view (viewed from an element mounting board) showing the p-side pad electrode in FIG. 3A. FIG. 3C is a bottom view showing a different shape of an electrode bonding portion.

As shown in FIG. 3B, the p-side pad electrode 28 is provided with an annular electrode bonding portion 28d with a diameter smaller than the outer diameter of the p-side pad electrode 28. Thereby, the bonding strength to the ITO layer 25 can be enhanced. As shown in FIG. 3A, the SiO2 layer 26 formed inside and outside the annular electrode bonding portion 28d allows total reflection of light emitted toward the electrode formation surface so as to enhance the reflection performance. Alternately, the annular electrode bonding portion 28d may not be formed continuously. As shown in FIG. 3C, the annular electrode bonding portion 28d may be formed series of islands disposed annularly. Furthermore, the entire p-side pad electrode 28 may be formed of silver (Ag) as in FIG. 2D.

Figure 4A:
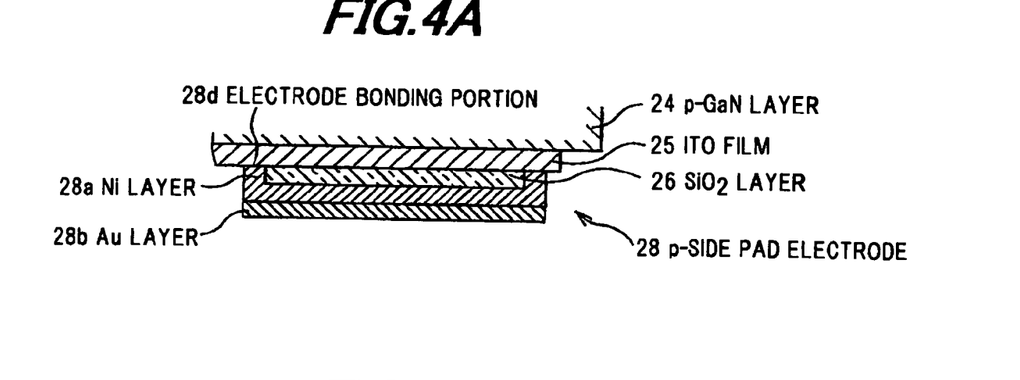
FIG. 4A is an enlarged cross sectional view showing another modification of the p-side pad electrode in the first embodiment.
Figure 4B:
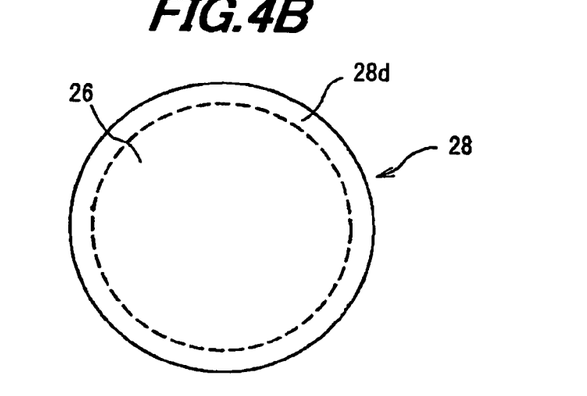
FIG. 4B is a bottom view (viewed from an element mounting board) showing the p-side pad electrode in FIG. 4A.
Figure 4C:
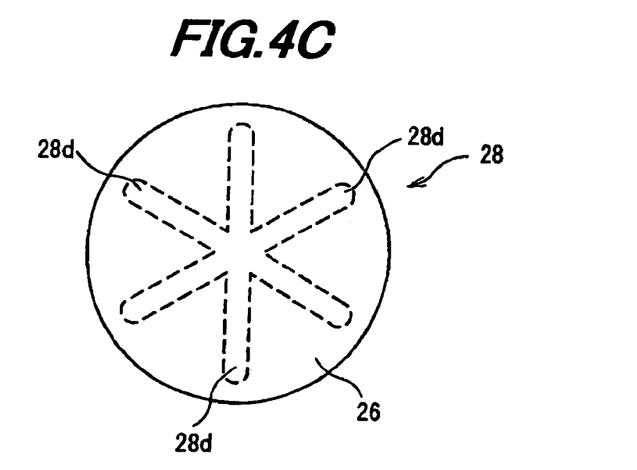
FIG. 4C is a bottom view showing a different shape of an electrode bonding portion.

FIG. 4A is an enlarged cross sectional view showing another modification of the p-side pad electrode in the first embodiment. FIG. 4B is a bottom view (viewed from an element mounting board) showing the p-side pad electrode in FIG. 4A. FIG. 4C is a bottom view showing a different shape of an electrode bonding portion.

As shown in FIGS. 4A and 4B, the p-side pad electrode 28 of this modification has the annular electrode bonding portion 28d formed along the circular edge of the p-side pad electrode 28, and the SiO2 layer 26 is formed a concentric circle inside the electrode bonding portion 28d. In this composition, the p-side pad electrode 28 can have a large area that allows interface reflection based on the refractive index difference between the ITO layer 25 and the SiO$_2$ layer 26 so as to further enhance the light extraction efficiency. Alternately, instead of being formed along the circular edge of the p-side pad electrode 28, as shown in FIG. 4C, the electrode bonding portion 28d may be formed radially in six directions from the center of the p-side pad electrode 28. Even in this case, the area allowing the interface reflection can be increased. The entire p-side pad electrode 28 may be formed of silver (Ag) as in FIG. 2D.

Figure 5A:
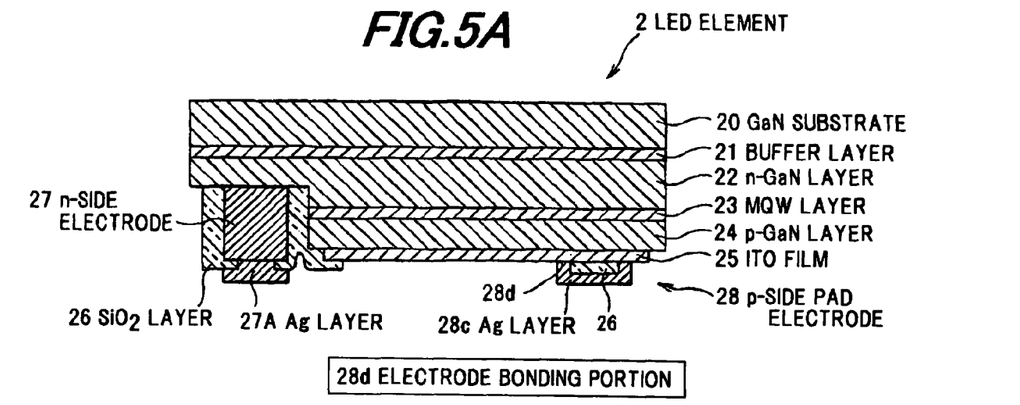
FIG. 5A is a cross sectional view showing an LED element in a second preferred embodiment according to the invention.
Figure 5B:
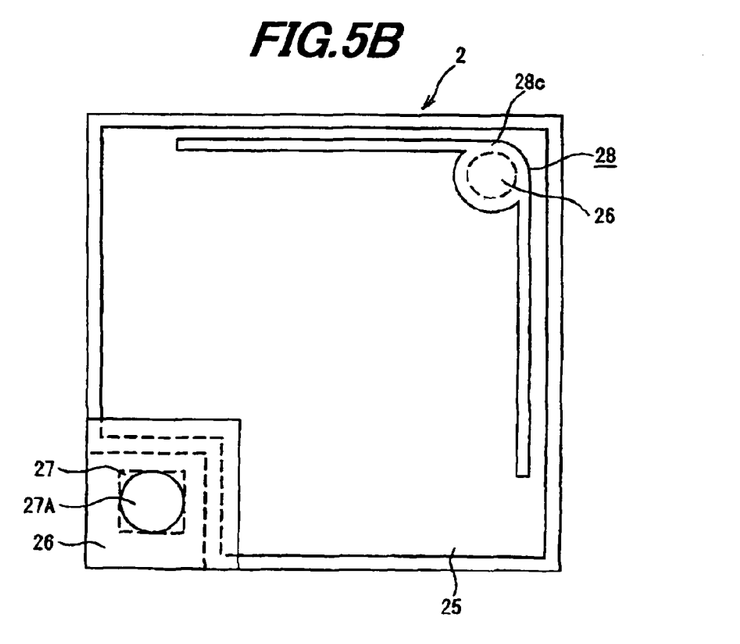
FIG. 5B is a bottom view showing an electrode formation surface of the LED element in FIG. 5A.

FIG. 5A is a cross sectional view showing an LED element in the second preferred embodiment according to the invention. FIG. 5B is a bottom view showing an electrode formation surface of the LED element in FIG. 5A. Hereinafter, like components are indicated by using the same numerals as in the first embodiment and explanations thereof are omitted below.

As shown in FIG. 5B, the LED element 2 is constructed such that the n-side electrode 27 and the p-side pad electrode 28 are diagonally disposed. The LED element 2 is formed 346 μm square in chip size. As shown in FIG. 5A, the n-side electrode 27 is formed of ITO of $7 \times 10^{-6}/°$ C. in thermal expansion coefficient and the circular SiO$_2$ layer 26 is formed as a dielectric film covering the n-side electrode 27. The p-side pad electrode 28 is formed with a Ag layer 28c covering the top face and the periphery of the SiO$_2$ layer 26, and, as shown in FIG. 5B, the Ag layer 28c extends two linear portions 28e parallel to the sides of the element.

In this embodiment, the n-side electrode 27 is formed of ITO that allows the LED element 2 to be difficult to cause separation of the n-side and p-side electrodes based on the difference in thermal expansion coefficient from the GaN epitaxial layer. Therefore, when the LED element 2 thus constructed is mounted on the element mounting board 3 and then glass-sealed, the glass-sealed light emitting device 1 can be stable in bonding strength and excellent in reliability.

Figure 6A:
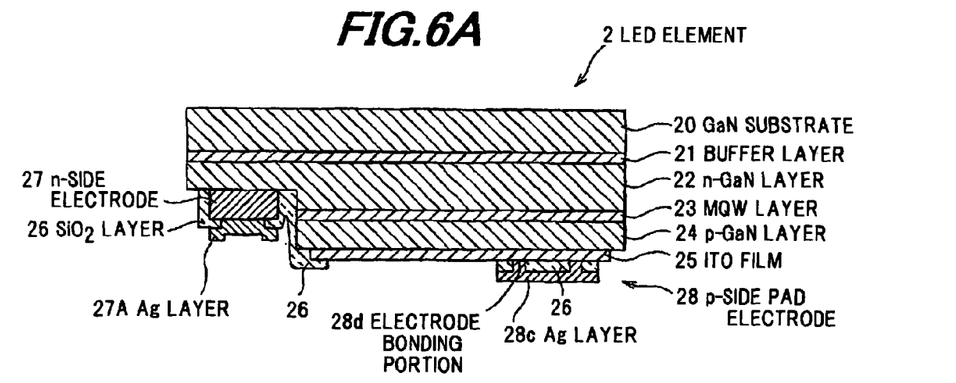
FIG. 6A is a cross sectional view showing an LED element in a third preferred embodiment according to the invention.
Figure 6B:
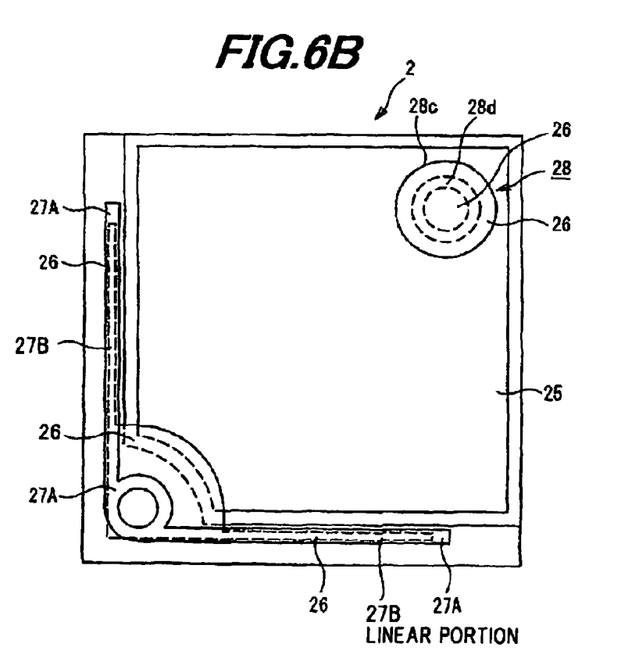
FIG. 6B is a bottom view showing an electrode formation surface of the LED element in FIG. 6A.

FIG. 6A is a cross sectional view showing an LED element in the third preferred embodiment according to the invention. FIG. 6B is a bottom view showing an electrode formation surface of the LED element in FIG. 6A.

As shown in FIG. 6B, the LED element 2 is constructed such that the n-side electrode 27 and the p-side pad electrode 28 are diagonally disposed. The LED element 2 is formed 346 μm square in chip size. As shown in FIG. 6A, the n-side electrode 27 is formed of ITO of $7 \times 10^{-6}/°$ C. in thermal expansion coefficient and, as shown in FIG. 6B, the n-side electrode 27 is provided with two linear portions 27B, 27B formed along the sides of the element. The p-side pad electrode 28 is provided with an annular electrode bonding portion 28d with a diameter smaller than the outer diameter of the p-side pad electrode 28, and the circular and annular SiO2 layer 26 contacting the ITO layer 25 is covered with the Ag layer 28c.

In this embodiment, the n-side electrode 27 is formed of ITO and the linear portions 27B, 27B are formed along the sides of the element. Thereby, as in the second embodiment, the LED element 2 can be difficult to cause separation of the n-side and p-side electrodes. Moreover, current spreading property to the n-GaN layer 22 can be enhanced to prevent unevenness in emission from the MQW layer 23.

Figure 7:
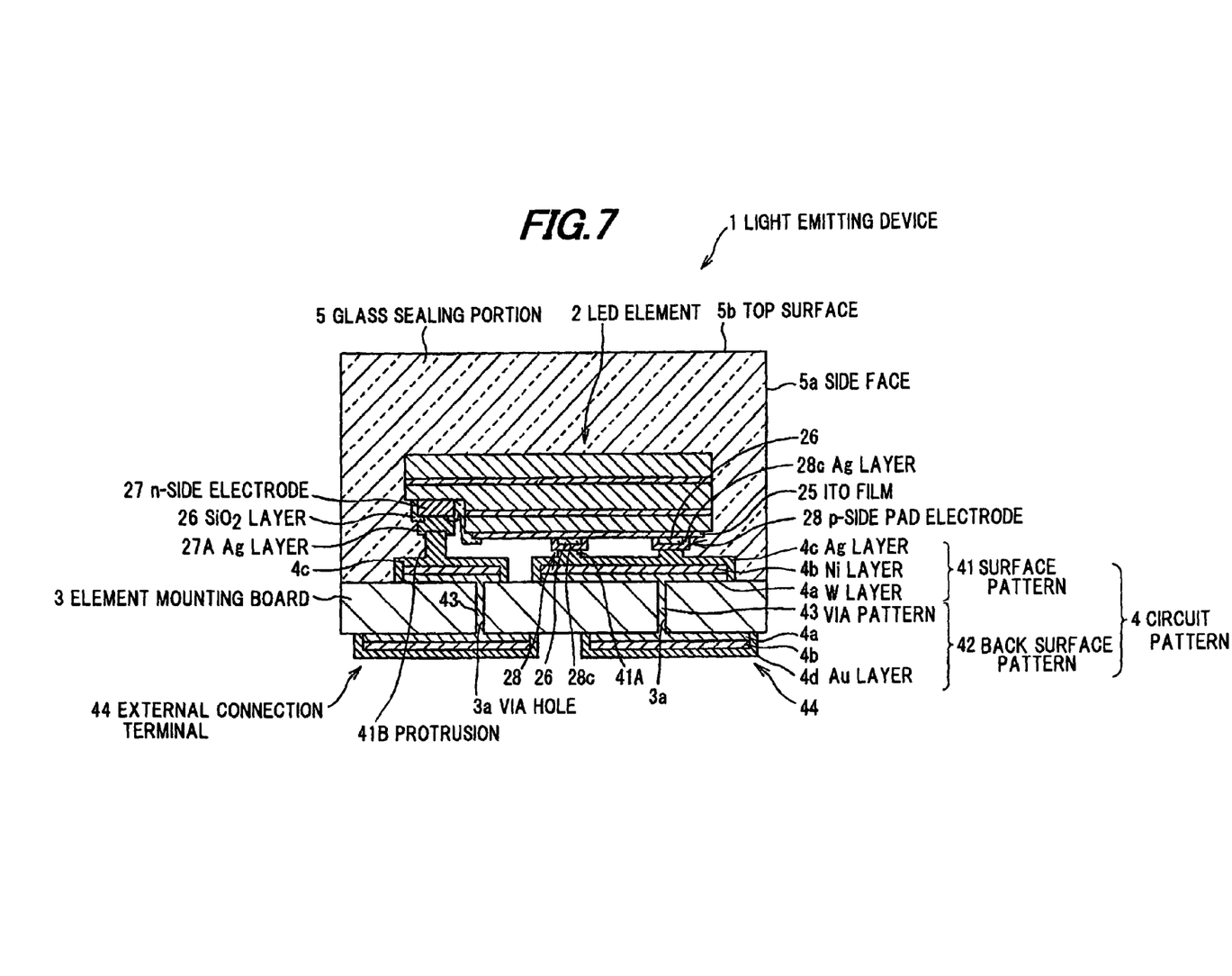
FIG. 7 is a cross sectional view showing a glass-sealed LED as a light emitting device in a fourth preferred embodiment according to the invention.

FIG. 7 is a cross sectional view showing a glass-sealed LED as a light emitting device in the fourth preferred embodiment according to the invention.

As shown in FIG. 7, the light emitting device 1 is composed of the LED element 2 which is a flip-chip type light emitting element formed of a GaN based semiconductor material, the element mounting board 3 for mounting the LED element 2 thereon, the circuit pattern 4 formed on the element mounting board 3 for supplying power to the LED element 2, and the glass sealing portion 5 which seals the LED element 2 on the element mounting board 3. This composition is the same as the first embodiment, but the light emitting device 1 of this embodiment is different in that the LED element 2 is bonded through multiple points to the surface pattern 41, and that the Ag layer 27A for bonding the n-side electrode 27 and the p-side pad electrode 28 are bonded to protrusions 41B and 41A, respectively, of the surface pattern 41 without using the Au bumps 6 as shown in FIG. 1.

Figure 8:
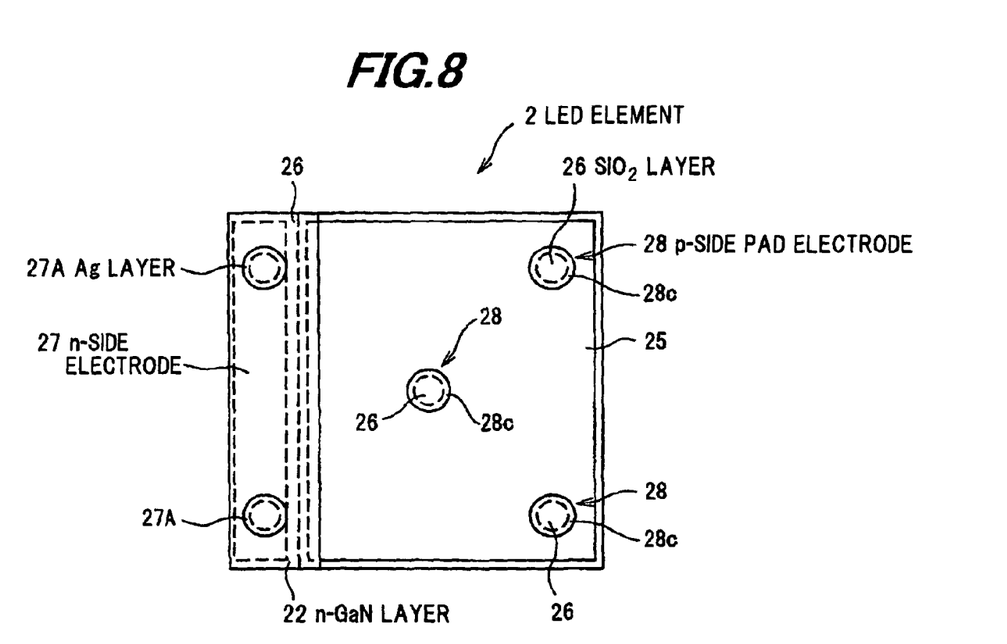
FIG. 8 is a bottom view showing an electrode formation surface of an LED element in FIG. 7.

FIG. 8 is a bottom view showing an electrode formation surface of the LED element of the fourth embodiment as shown in FIG. 7.

As shown in FIG. 8, the LED element 2 is provided with the two n-side electrodes 27 and the three p-side pad electrodes 28. The Ag layer 27A is formed linearly along the side with exposed n-GaN 22 of the element. The p-side pad electrodes 28 are formed at three points in total, i.e., one formed near the center of the element and two formed at the corners of the element. The p-side pad electrode 28 is formed such that the Ag layer 28c covers the circular SiO2 layer 26 formed on the ITO layer 25.

As described, the LED element 2 may be bonded through the multiple points to the surface pattern 41 on the element mounting board 3. Thereby, reliability in electrical connection can be enhanced and heat dissipation performance can be secured when feeding large current so as to suppress temperature rise of the LED element 2.

In this embodiment, the LED element 2 is bonded to the protrusions 41A, 41B of the surface pattern 41 without using the Au bumps 6 as shown in FIG. 1. In the glass-sealed light emitting device 1, although the glass sealing portion 5 and the element mounting board 3 are firmly bonded to each other by the hot pressing of the fused glass, the Ag layer 27A and the p-side pad electrode 28 are also press-bonded to protrusions 41B and 41A, respectively, by the glass at high viscosity. Further, the LED element 2 can be stably held by the strength of the glass sealing portion 5 so that bond failure does not occur.

In the above embodiments, the glass sealing portion 5 is formed like a rectangular solid. However, it is not limited to this form and may be formed semispherical or lens-like. The glass sealing portion 5 may include diffusing particles.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A light emitting device, comprising:
a light emitting element comprising a contact electrode comprising a transparent conductive film, a transparent dielectric layer formed on a surface of the contact electrode and having a refractive index lower than a refractive index of the contact electrode, a pad electrode that contacts said surface of the contact electrode to electrically connect to the contact electrode, and a semiconductor layer that abuts the contact electrode;
an element mounting board comprising a wiring layer on an element mounting surface thereof, the light emitting element being flip-chip mounted on the wiring layer; and
a sealing portion that seals the light emitting element, said sealing portion abutting the semiconductor layer, wherein a part of the transparent dielectric layer is formed between the contact electrode and the pad electrode.

2. The light emitting device according to claim 1, wherein: the sealing portion comprises an inorganic material.

3. The light emitting device according to claim 2, wherein: the inorganic material comprises a fused glass.

4. The light emitting device according to claim 3, wherein: the transparent dielectric layer covers a surface of the pad electrode.

5. The light emitting device according to claim 3, wherein: the pad electrode comprises nickel (Ni) and gold (Au).

6. The light emitting device according to claim 3, wherein: the pad electrode comprises silver (Ag).

7. The light emitting device according to claim 3, wherein: the contact electrode comprises ITO (indium tin oxide).

8. The light emitting device according to claim 3, wherein: the wiring layer comprises a silver (Ag) layer on a top thereof.

9. The light emitting device according to claim 1, wherein the transparent dielectric layer comprises a bonding plane to the contact electrode, and
wherein the bonding plane has an area smaller than an area of a top surface of the pad electrode.

10. The light emitting device according to claim 9, wherein:
the pad electrode comprises an annular bonding portion to the contact electrode, and
the bonding plane is formed except the annular bonding portion of the pad electrode.

11. The light emitting device according to claim 9, wherein:
the pad electrode comprises a radial bonding portion to the contact electrode, and
the bonding plane is formed except the radial bonding portion of the pad electrode.

12. The light emitting device according to claim 1, wherein said part of the transparent dielectric layer is disposed below said surface of the contact electrode.

13. The light emitting device according to claim 1, wherein said part of the transparent dielectric layer is sandwiched between said surface of the contact electrode and an exposed top surface of the pad electrode.

14. The light emitting device according to claim 1, wherein said part of the transparent dielectric layer contacts said surface of the contact electrode below the contact electrode and contacts an exposed top surface of the pad electrode.

15. The light emitting device according to claim 1, wherein, in a plan view, said pad electrode is confined inside the contact electrode.

16. The light emitting device according to claim 1, wherein the pad electrode contacts said surface of the contact electrode through an opening formed in the transparent dielectric layer.

17. A light emitting device, comprising:
a light emitting element, comprising:
a contact electrode comprising a transparent conductive film;
a transparent dielectric layer formed on a surface of the contact electrode;
a pad electrode that contacts said surface of the contact electrode through an opening formed in the transparent dielectric layer to electrically connect to the contact electrode, a part of the transparent dielectric layer being formed between the contact electrode and the pad electrode; and
a semiconductor layer abutting the contact electrode;

an element mounting board comprising a wiring layer on an element mounting surface thereof; and a sealing portion that seals the light emitting element, said sealing portion abutting the semiconductor layer.

18. The light emitting device according to claim 17, wherein said part of the transparent dielectric layer contacts said surface of the contact electrode below the contact electrode and contacts an exposed top surface of the pad electrode.

19. A light emitting element, comprising:

a contact electrode comprising a transparent conductive film;

a transparent dielectric layer formed on a surface of the contact electrode, the transparent dielectric layer having a refractive index lower than that of the contact electrode;

a pad electrode that contacts said surface of the contact electrode through an opening formed in the transparent dielectric layer to electrically connect to the contact electrode;

a semiconductor layer abutting the contact electrode: and a sealing portion that seals the light emitting element and abuts the semiconductor layer, wherein a part of the transparent dielectric layer is formed between the contact electrode and the pad electrode, and wherein said part of the transparent dielectric layer contacts said surface of the contact electrode below the contact electrode and contacts an exposed top surface of the pad electrode.

20. The light emitting element according to claim 19, wherein, in a plan view, said pad electrode is confined inside the contact electrode.

* * * * *